US011073737B2

(12) United States Patent
Masini et al.

(10) Patent No.: US 11,073,737 B2
(45) Date of Patent: Jul. 27, 2021

(54) METHOD AND SYSTEM FOR AN ALL-OPTICAL WAFER ACCEPTANCE TEST

(71) Applicant: Luxtera LLC., Wilmington, DE (US)

(72) Inventors: Gianlorenzo Masini, Carlsbad, CA (US); Roman Bruck, Carlsbad, CA (US); Kam-Yan Hon, Oceanside, CA (US); Attila Mekis, Carlsbad, CA (US)

(73) Assignee: Luxtera LLC, Wilmington, DE (US)

( * ) Notice: Subject to any disclaimer, the term of this patent is extended or adjusted under 35 U.S.C. 154(b) by 0 days.

(21) Appl. No.: 16/729,668

(22) Filed: Dec. 30, 2019

(65) Prior Publication Data

US 2020/0209704 A1    Jul. 2, 2020

Related U.S. Application Data

(60) Provisional application No. 62/787,017, filed on Dec. 31, 2018.

(51) Int. Cl.
*G02B 6/34* (2006.01)
*G02F 1/225* (2006.01)
(Continued)

(52) U.S. Cl.
CPC ....... *G02F 1/2252* (2013.01); *G02B 6/12004* (2013.01); *G02B 6/34* (2013.01);
(Continued)

(58) Field of Classification Search
CPC .... G02F 1/2252; G02F 1/2257; G02F 1/0123; G02F 2001/212; G02B 6/34;
(Continued)

(56) References Cited

U.S. PATENT DOCUMENTS 8,615,028 B1 * 12/2013 Sayyah ............... H01S 5/4006
372/50.123
2010/0128336 A1    5/2010 Witzens et al.
(Continued)

OTHER PUBLICATIONS

PCT Notification of Transmittal of the International Search Report and the Written Opinion of the International Searching Authority, or the Declaration for Application No. PCT/US19/69066 dated Apr. 24, 2020.

*Primary Examiner* — Ellen E Kim
(74) *Attorney, Agent, or Firm* — Patterson + Sheridan, LLP

(57) ABSTRACT

Methods and systems for an all-optical wafer acceptance test may include an optical transceiver on a chip, the optical transceiver comprising first, second, and third grating couplers, an interferometer comprising first and second phase modulators, a splitter, and a plurality of photodiodes. A first input optical signal may be received in the chip via the first grating coupler, where the first input optical signal may be coupled to the interferometer. An output optical signal may be coupled out of the chip via the second grating coupler for a first measurement of the interferometer. A second input optical signal may be coupled to a third grating coupler and a portion of the second input optical signal may be communicated to each of the plurality of photodiodes via the splitter. A voltage may be generated using the photodiodes based on the second input signal that may bias the first phase modulator.

20 Claims, 6 Drawing Sheets

(51) Int. Cl.
*G02F 1/01* (2006.01)
*H04B 10/40* (2013.01)
*G02B 6/12* (2006.01)
*G02F 1/21* (2006.01)

(52) U.S. Cl.
CPC .......... *G02F 1/0123* (2013.01); *G02F 1/2257* (2013.01); *H04B 10/40* (2013.01); *G02F 1/212* (2021.01)

(58) Field of Classification Search
CPC ................ G02B 6/12004; H04B 10/40; H04B 10/0779; G01R 31/31728
See application file for complete search history.

(56) References Cited

U.S. PATENT DOCUMENTS

| 2011/0305414 | A1* | 12/2011 | Mekis | G02B 6/29344 385/3 |
| 2015/0219847 | A1* | 8/2015 | Mack | G02B 6/4286 385/14 |
| 2017/0357066 | A1 | 12/2017 | Mack et al. | |

\* cited by examiner

METHOD AND SYSTEM FOR AN ALL-OPTICAL WAFER ACCEPTANCE TEST

CROSS-REFERENCE TO RELATED APPLICATIONS/INCORPORATION BY REFERENCE

This application claims priority to and the benefit of U.S. Provisional Application No. 62/787,017 filed on Dec. 31, 2018, which is hereby incorporated herein by reference in its entirety.

FIELD

Aspects of the present disclosure relate to electronic components. More specifically, certain implementations of the present disclosure relate to methods and systems for an all-optical wafer acceptance test.

BACKGROUND

Conventional approaches for wafer testing may be costly, cumbersome, and/or inefficient—e.g., they may be complex and/or time consuming, and/or may reduce yields.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for an all-optical wafer acceptance test, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the eight-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

Figure 1:
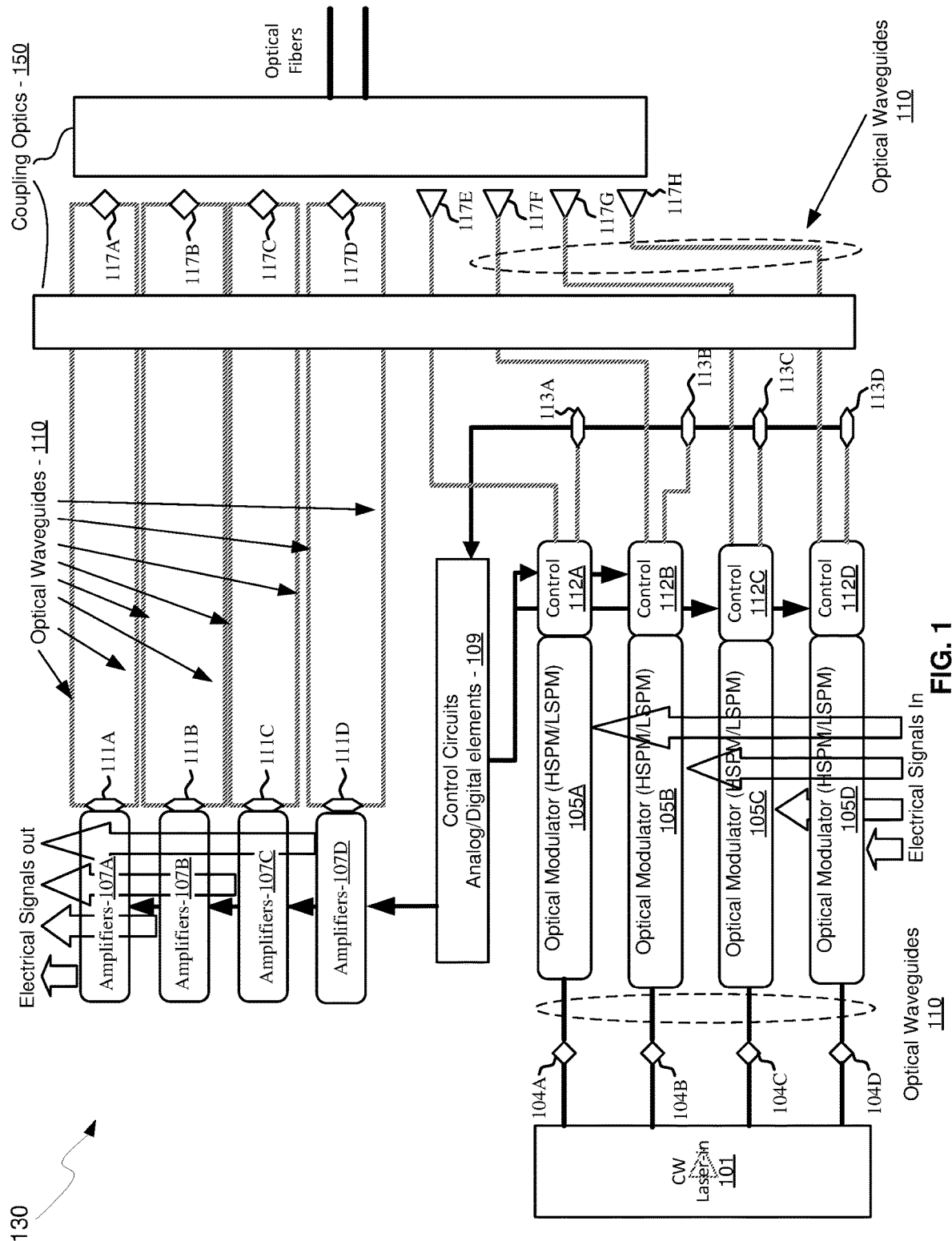
FIG. 1 is a block diagram of a photonically-enabled integrated circuit, in accordance with an example embodiment of the disclosure.

FIG. 1 is a block diagram of a photonically-enabled integrated circuit, in accordance with an example embodiment of the disclosure. Referring to FIG. 1, there are shown optoelectronic devices of a photonically-enabled integrated circuit 130 comprising optical modulators 105A-105D, photodiodes 111A-111D, monitor photodiodes 113A-113D, and optical devices comprising couplers 103A-103C and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example. Optional coupling optics 150 may comprise beam splitters, thin film filters, mirrors, prisms, etc., and may be integrated on the interposer as well as external to the interposer.

In an example scenario, the photonically-enabled integrated circuit 130 comprises one or more CMOS electronics die coupled to a CMOS photonics interposer die with a laser assembly 101 also coupled to the top surface of the interposer. The laser assembly 101 may comprise one or more semiconductor lasers with isolators, lenses, and/or rotators for directing one or more continuous-wave (CW) optical signals to the couplers 104A-104D. The CW optical signals may be at different wavelengths for CWDM operation, such as CWDM4, for example. The photonically enabled integrated circuit 130 may be integrated on a plurality of die, such as with one or more electronics die and one or more photonics die.

The grating couplers 104A-104D comprise grating structures with grating spacing and width configured to couple optical signals of a specific wavelength and polarization into the IC 130. A lens array may be incorporated between the grating couplers 104A-104D and the laser assembly 101 for focusing of the optical signal to the grating couplers for increased coupling efficiency.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode. Such one mode may have, for example, a polarization that is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

The optical modulators 105A-105D comprise Mach-Zehnder or ring modulators, for example, and enable the modulation of the continuous-wave (CW) laser input signals. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

In an example scenario, the high-speed optical phase modulators may operate based on the free carrier dispersion effect and may demonstrate a high overlap between the free carrier modulation region and the optical mode. High-speed phase modulation of an optical mode propagating in a waveguide is the building block of several types of signal encoding used for high data rate optical communications. Speed in the tens of Gb/s may be required to sustain the high data rates used in modern optical links and can be achieved in integrated Si photonics by modulating the depletion region of a PN junction placed across the waveguide carrying the optical beam. In order to increase the modulation efficiency and minimize the loss, the overlap between the optical mode and the depletion region of the PN junction must be carefully optimized.

One output of each of the optical modulators 105A-105D may be optically coupled via the waveguides 110 to the grating couplers 117E-117H. The other outputs of the optical modulators 105A-105D may be optically coupled to monitor photodiodes 113A-113D to provide a feedback path. The IC 130 may utilize waveguide based optical modulation and receiving functions. Accordingly, the receiver may employ an integrated waveguide photo-detector (PD), which may be implemented with epitaxial germanium/SiGe films deposited directly on silicon, for example.

The grating couplers 104A-104D and 117A-117H may comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 104A-104D and 117A-117H may comprise single polarization grating couplers (SPGC) and/or polarization splitting grating couplers (PSGC). In instances where a PSGC is utilized, two input, or output, waveguides may be utilized, as shown for grating couplers 117A-117D, although these may instead be SPGCs.

The optical fibers may be epoxied, for example, to the CMOS interposer, using a fiber coupler that selectively deflects optical signals of different wavelengths to and from different grating couplers on the chip, the photonically-enabled integrated circuit 130, with each coupler, such as each of the grating couplers 117A-117H being configured to couple optical signals of different wavelengths.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 μm optical wavelength range, and may be integrated on a CMOS silicon-on-insulator (SOI) wafer.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enables modulation of the CW laser signal received from the splitters 103A-103C. The optical modulators 105A-105D may require high-speed electrical signals to modulate the refractive index in respective branches of a Mach-Zehnder interferometer (MZI), for example.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Integrated photonics platforms allow the full functionality of an optical transceiver to be integrated on a single chip or a plurality of chips in a flip-chip bonded structure. An optical transceiver contains optoelectronic circuits that create and process the optical/electrical signals on the transmitter (Tx) and the receiver (Rx) sides, as well as optical interfaces that couple the optical signals to and from a fiber. The signal processing functionality may include modulating the optical carrier, detecting the optical signal, splitting or combining data streams, and multiplexing or demultiplexing data on carriers with different wavelengths.

Wafer Acceptance Test (WAT) is commonly used in the electronic industry to determine the quality of semiconductor wafers at the end of the fabrication process. By testing a reduced subset of devices at wafer scale, the performance of the overall product can be inferred, thus giving confidence to the wafer customer that the processing has been executed correctly.

With the introduction of photonics in the silicon industry, new devices have emerged, and new test requirements had to be defined. Among these devices, some can be tested purely optically, by coupling a light beam of an appropriate wavelength into the wafer and collecting the output. Optical input and output are enabled by coupling elements such as the grating couplers 104A-104D and 117A-117H, which couple the light from/to an optical fiber to/from an optical waveguide present on the wafer. Waveguides, splitters, and the coupling elements are optically testable devices.

Other devices require an electrical biasing in order to be properly evaluated. Optoelectronic phase modulators, such as the modulators 105A-105D, relying on carrier dispersion or the Kerr effect, belong to this group. The phase shift impressed on an optical beam by these devices is a function of the applied voltage. In order to measure this dependency, the device is typically embedded in an unbalanced interferometric structure which converts the phase shift modulation into an amplitude modulation. The interferometer imbalance induces an oscillatory behavior in the amplitude modulation with wavelength. By comparing the phase of the oscillations at two (or more) applied biases, the transfer function of the phase modulation of the device under test (DUT) can be extracted.

Figure 2:
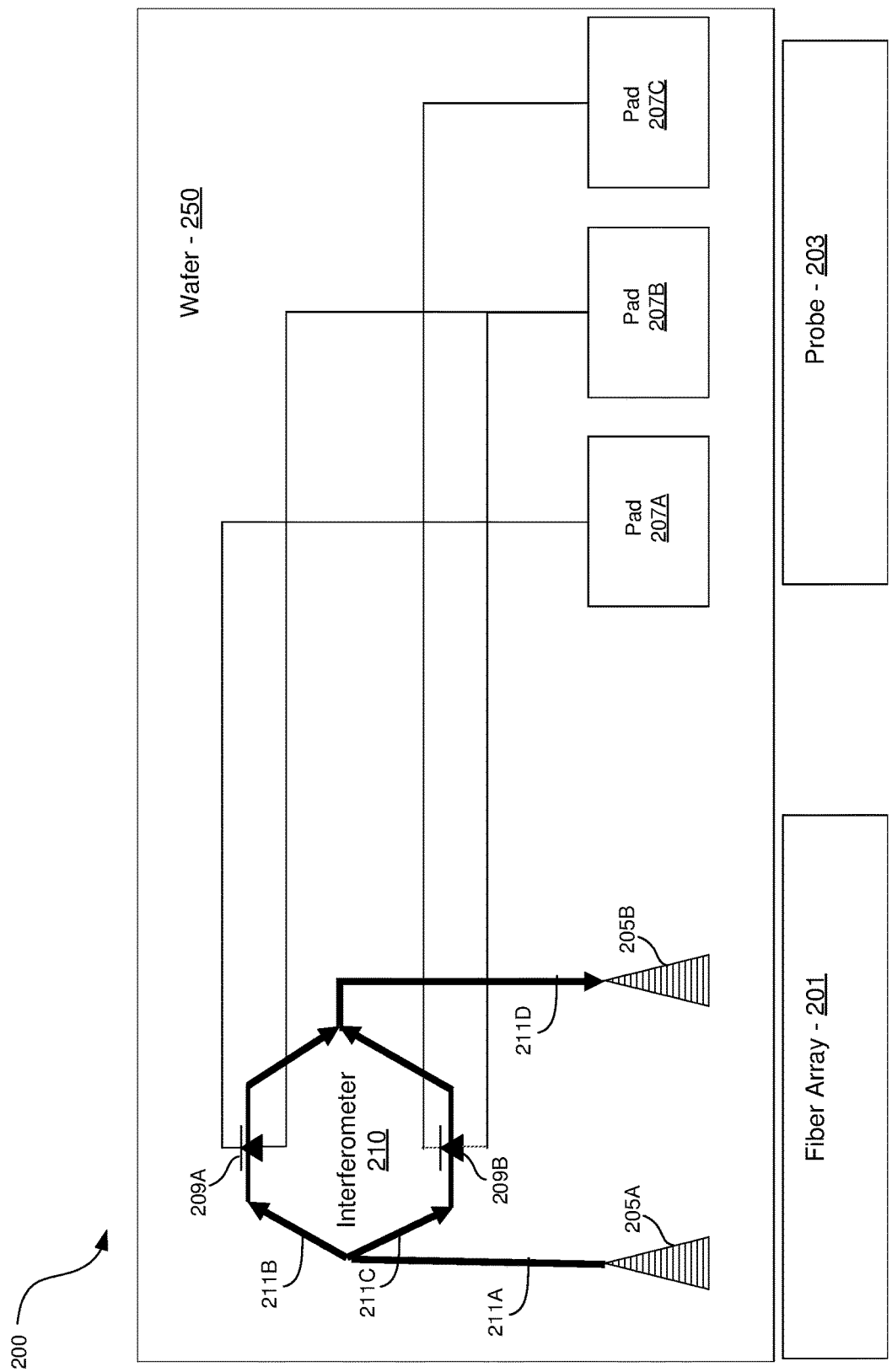
FIG. 2 is a schematic illustrating a wafer acceptance test setup with both optical and electrical probing, in accordance with an embodiment of the disclosure.

FIG. 2 is a schematic illustrating a wafer acceptance test setup with both optical and electrical probing, in accordance with an embodiment of the disclosure. Referring to FIG. 2, there is shown wafer acceptance test system 200 with a fiber array 201 and electrical probe 203 that couple to the wafer 250 for testing purposes. The wafer 250 comprises couplers 205A and 205B, pads 207A-207C, phase modulators 209A and 209B, and waveguides 211A-211D. The phase modulators 209A-209B and waveguides 211A-211D may comprise an optical modulator interferometer 210 with input optical signals received via the coupler 205A and output optical signals communicated out of the wafer 250 via the coupler 205B. The couplers 205A and 205B may comprise single polarization grating couplers or polarization splitting grating couplers, although single polarization grating couplers are shown in FIG. 2.

Proper wafer acceptance testing of phase modulators requires the simultaneous presence of an optical probe, the fiber array 201 in this example, to supply light into the device or devices being tested and record the interferometer output, as well as an electrical probe 203, used to supply the voltage to the device. The electrical probe 203 provides a bias voltage to the phase modulators 209A and 209B This complicates the system setup since three independent elements including the device, wafer 250, the fiber array 201 (optical probe), and the electrical probe 203 need to be coordinated in order to perform the positioning and alignment. Modern probing systems, however, offer the possibility to coordinate only two: either the device and the electrical probe, or the device and the fiber.

Due to the availability of integrated photodiodes in the wafer under test, the need for external electrical probing can be removed. In fact, photodiodes can be used to supply a voltage/current once illuminated, in a fashion similar to solar cells. In particular, germanium photodiodes, once illuminated, can convert the energy of the impinging photons into electrical power that is suitable to be used to bias other devices on wafer.

Figure 3:
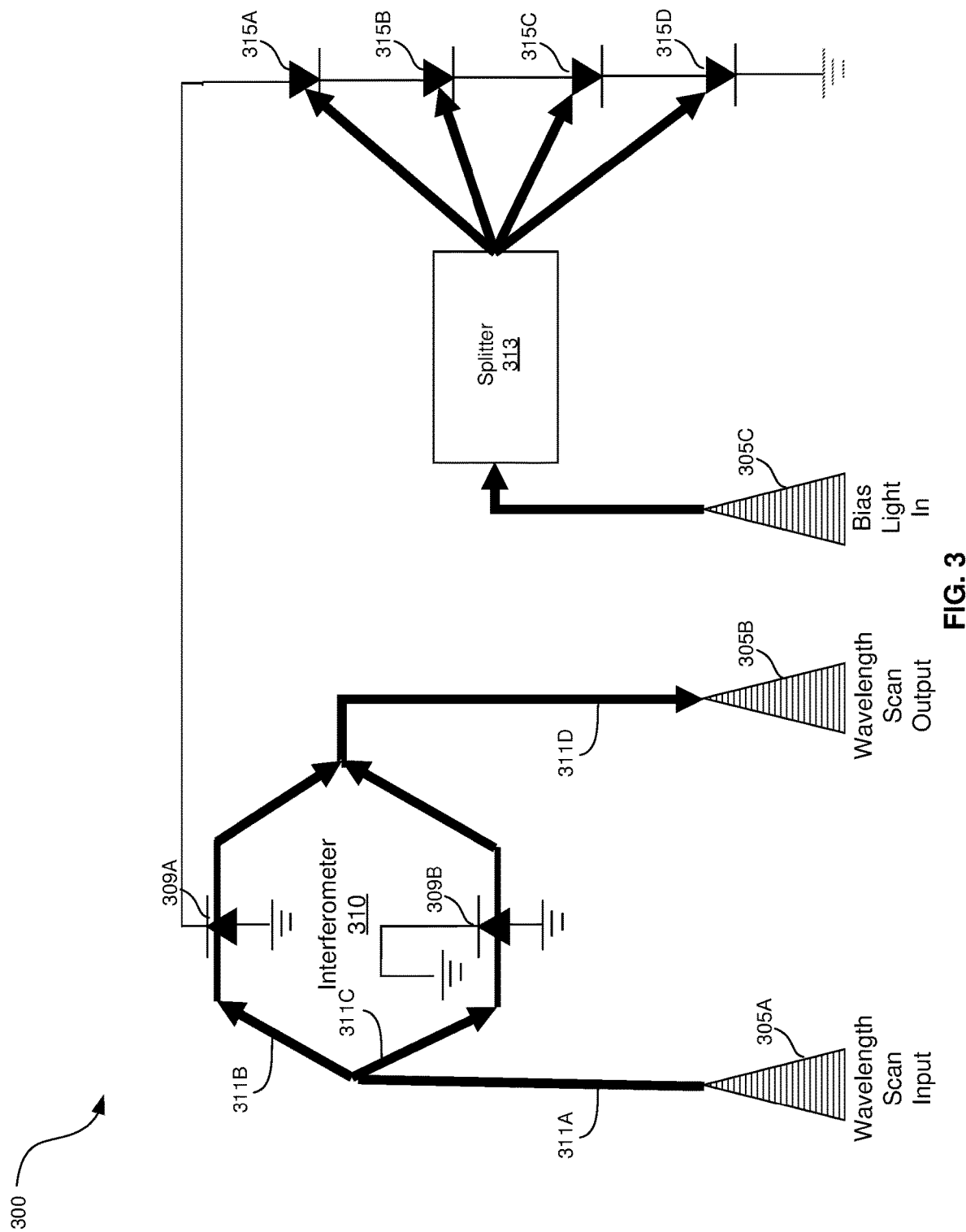
FIG. 3 illustrates an all-optical wafer test configuration, in accordance with an example embodiment of the disclosure.

FIG. 3 illustrates an all-optical wafer test configuration, in accordance with an example embodiment of the disclosure. Referring to FIG. 3, there is shown an all-optical wafer acceptance test system 300 for testing the interferometer modulator 310, where the interferometer modulator 310 comprises phase modulators 309A and 309B and waveguides 311A-311D. Each of the components shown in FIG. 3 may be integrated on a single photonics die.

The couplers 305A-305C may comprise grating couplers, for example, where the couplers 305A and 305B couple optical signals into and out of, respectively, the modulator 310, and the coupler 305C couples a biasing optical signal into the splitter 313. The splitter 313 may comprise a 1:N optical splitter, where N=4 in the example of FIG. 3, and may split optical signals received via the coupler 305C to each of the photodiodes 315A-315D.

The phase modulators 309A-309B and waveguides 311A-311D may comprise an optical modulator interferometer 310 with input optical signals received via the coupler 305A and output optical signals communicated out of the wafer via the coupler 305B. The couplers 305A-305C may comprise single polarization grating couplers or polarization splitting grating couplers, although single polarization grating couplers are shown in FIG. 3.

In the example shown, germanium photodiodes 315A-315D are used to bias the High-Speed Phase Modulator (HSPM) 309A in order to extract its phase shift efficiency as a function of the applied voltage. The HSPMs 309A and 309B comprise a silicon p-n junction, for example. A number of Ge photodiodes may be connected in series in order to generate the bias needed for the HSPM test. For example, a bias voltage of 1.6V may be generated by the photodiodes 315A-315D. The photodiodes are connected directly to the HSPM 309A under test: when light is applied to the photodiodes 315A-315D, a voltage equal to the sum of the open circuit voltages ($V_{oc}$) of each photodiode is present on the HSPM 309A. When the light is turned off, no voltage is present across the HSPM 309A. Furthermore, the impedance of the HSPM is typically very high since the diode is used in reverse bias, which makes it an almost ideal "open" load so that the voltage at the output of the photodiodes 315A-315D is very close to the open circuit voltage ($V_{oc}$). By measuring the spectral response of the HSPM 309A embedded in the interferometer 310 in the two conditions, the HSPM 309A transfer function can be estimated. As the phase modulator 309B is directly adjacent and formed in the same process as the phase modulator 309A, its characteristics may also be inferred from those measured for phase modulator 309A.

Since $V_{oc}$ is logarithmically dependent on light intensity and photodiode responsivity, its value can be reasonably controlled even in the presence of photodiode characteristic or optical coupling efficiency variability. In order to improve the control over the bias applied to the HSPM 309A and reduce further its dependency on the light impinging on the photodiodes 315A-315D, a standard voltage regulator can be implemented by increasing the number of photodiodes connected in series, adding a series resistance and a number of forward bias silicon diodes as shown in FIG. 4.

Figure 4:
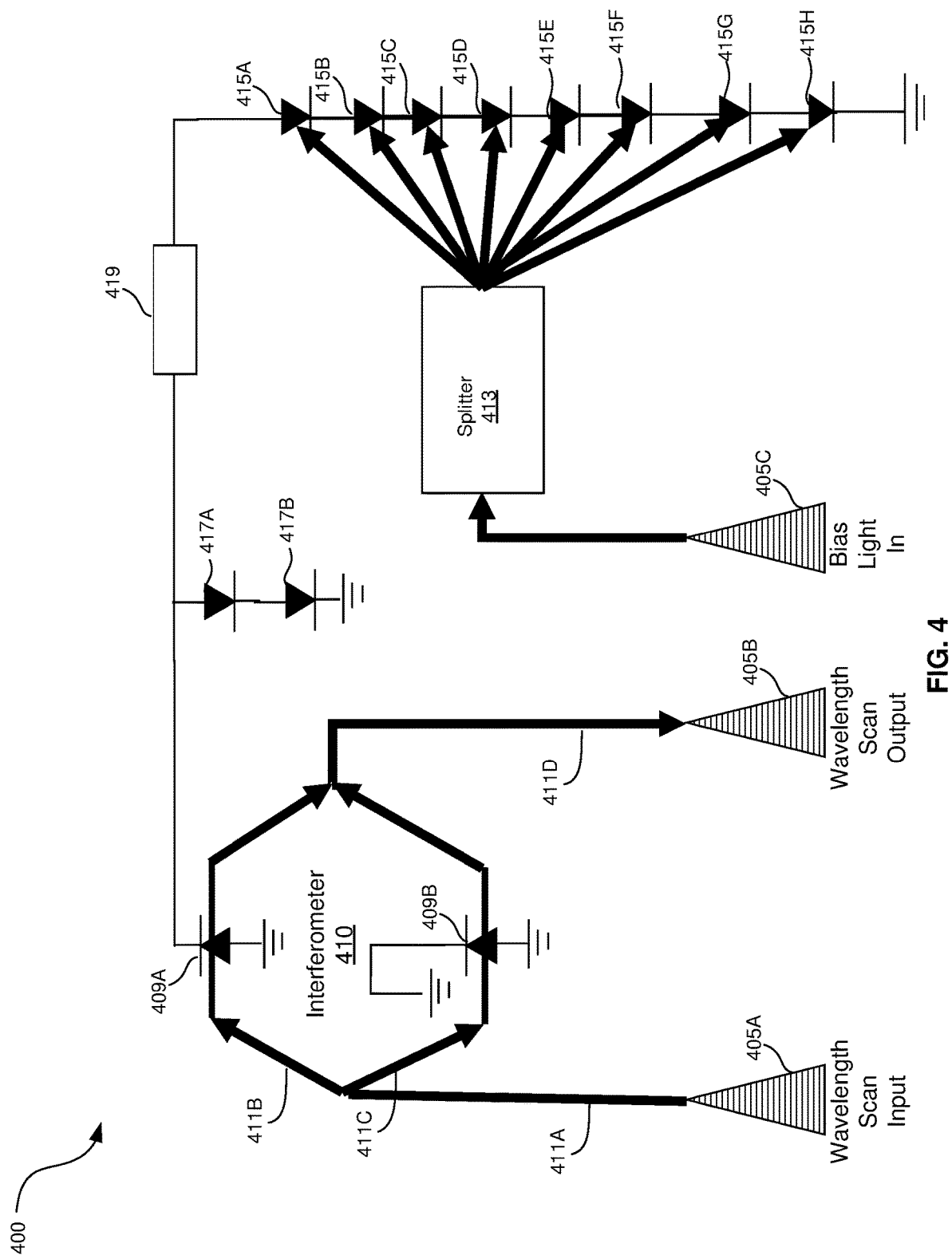
FIG. 4 illustrates an all-optical wafer test configuration with regulated optical bias, in accordance with an example embodiment of the disclosure.

FIG. 4 illustrates an all-optical wafer test configuration with regulated optical bias, in accordance with an example embodiment of the disclosure. Referring to FIG. 4, there is shown all-optical wafer acceptance test system 400 for testing the phase modulator interferometer 410, comprising phase modulators 409A and 409B and waveguides 411A-411D. Each of the components shown in FIG. 4 may be integrated on a single photonics die.

The couplers 405A-405C may comprise grating couplers, for example, where the couplers 405A and 405B couple optical signals into and out of, respectively, the interferometer 410, and the coupler 405C couples a biasing optical signal into the splitter 413. The splitter 413 may comprise a 1:N optical splitter, where N=8 in the example of FIG. 4, and may split optical signals received via the coupler 405C to each of the photodiodes 415A-415H.

The resistor 419 and forward-biased diodes 417A and 417B may comprise a voltage regulator for configuring a desired voltage to the phase modulator 409A from the larger bias voltage generated by the eight photodiodes 415A-415H. This regulation improves the control over the bias applied to the HSPM 409A and further reduces its dependency on the light impinging on the photodiodes 415A-415H, as the eight photodiodes 415A-415H generate a voltage well above that of two forward-biased diodes 417A and 417B. This configuration accurately sets the voltage across the modulator 409A nearly independent of the coupling efficiency into the grating coupler 405C.

In operation, optical signals may be coupled into grating coupler 405A and the output optical signal may be coupled out of grating coupler 405B. The frequency and intensity of the input signal may be varied to assess wavelength response when no optical signal is coupled into the Bias Light In input at grating coupler 405C, so that no bias is applied to the phase modulator 409A.

When an optical signal is coupled to the grating coupler 405C, the splitter 413 couples light to each of the photodiodes 415A-415H, thereby generating a voltage. This voltage across resistor 419 applies a current to forward-biased diodes 417A and 417B, and this consistent voltage from the forward-biased diodes is also applied across phase modulator 409A. Optical signals may again be applied to the Wavelength Scan Input grating coupler 405A and the output assessed at the Wavelength Scan Output via grating coupler 405B, where the input signal may be varied in intensity and/or wavelength, assessing the interferometer 410 in a biased state. Therefore, an all-optical wafer test is enabled by the photonic and electronic circuit of FIG. 4 without applying any electrical signals to the chip.

Figure 5:
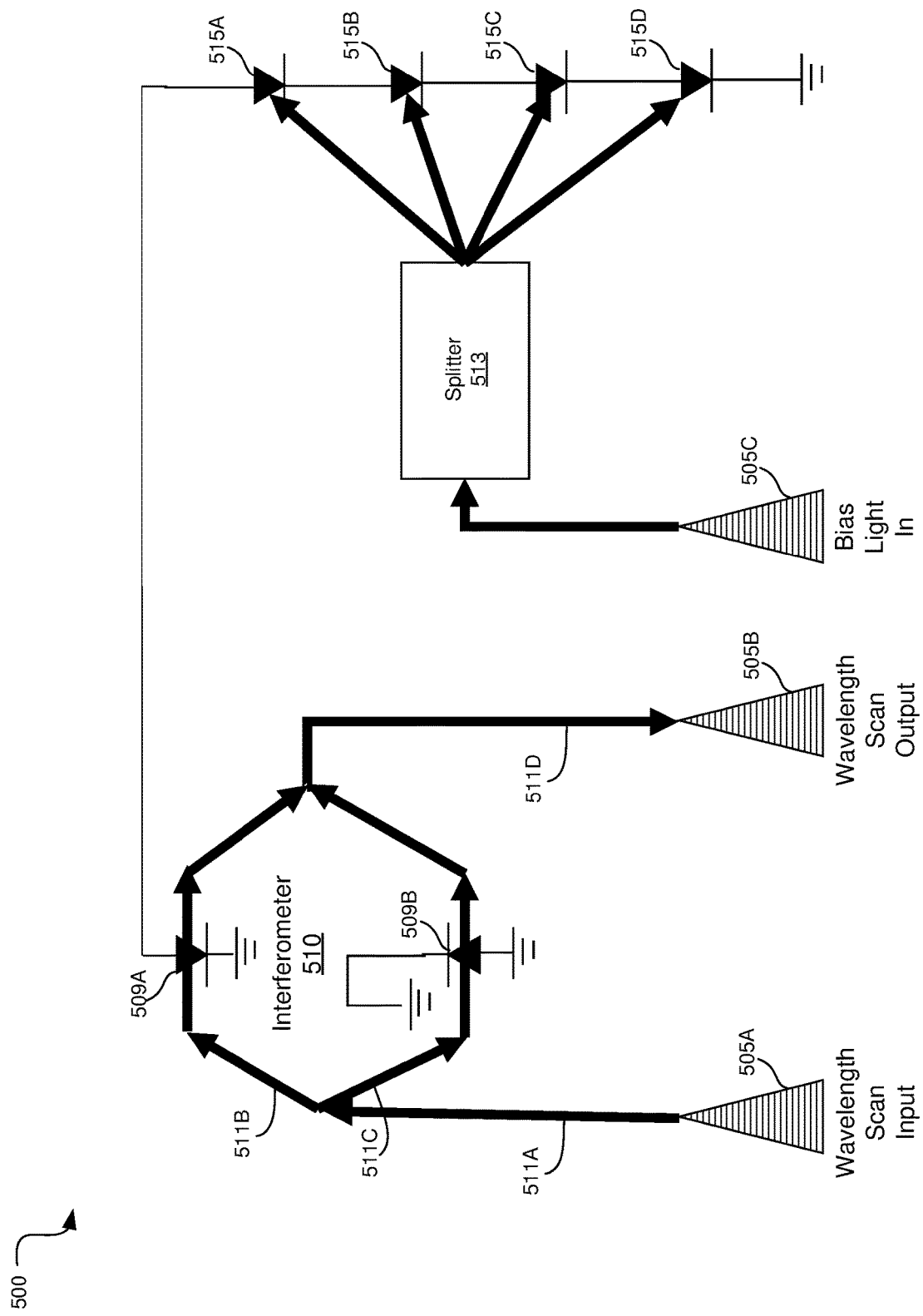
FIG. 5 illustrates optical wafer photodiode responsivity testing using current-based phase modulators, in accordance with an example embodiment of the disclosure.

FIG. 5 illustrates optical wafer photodiode responsivity testing using current-based phase modulators, in accordance with an example embodiment of the disclosure. Referring to FIG. 5, there is shown all-optical wafer acceptance test system 500 for testing the interferometer 510, where the interferometer 510 comprises phase modulators 509A and 509B and waveguides 511A-511D. Each of the components shown in FIG. 5 may be integrated on a single photonics die.

The couplers 505A-505C may comprise grating couplers, for example, where the couplers 505A and 505B couple optical signals into and out of, respectively, the interferometer 510, and the coupler 505C couples a bias optical signal into the splitter 513. The splitter 513 may comprise a 1:N optical splitter, where N=4 in the example of FIG. 5, and may split optical signals received via the coupler 505C to each of the photodiodes 515A-515D.

The phase modulators 509A and 509B and waveguides 511A-511D may comprise an optical modulator interferometer 510 with input optical signals received via the coupler 505A and output optical signals communicated out of the wafer via the coupler 505B. The couplers 505A-505C may comprise single polarization grating couplers or polarization splitting grating couplers, although single polarization grating couplers are shown in FIG. 5.

In operation, optical signals may be coupled into grating coupler 505A and the output optical signal may be coupled out of grating coupler 505B. The frequency and intensity of the input signal may be varied to assess wavelength response when no optical signal is coupled into the Bias Light In input at grating coupler 505C, so that no bias is applied to the phase modulator 509A.

When an optical signal is coupled to the grating coupler 505C, the splitter 513 couples light to each of the photodiodes 515A-515D, thereby generating a voltage applied across phase modulator 509A. Optical signals may again be applied to the Wavelength Scan Input grating coupler 505A and the output assessed at the Wavelength Scan Output 505B, where the input signal may be varied in intensity and/or wavelength, assessing the interferometer 510 in a biased state. Therefore, an all-optical wafer test is enabled by the photonic and electronic circuit of FIG. 5.

In the example shown in FIG. 5, the photodiode responsivity may be tested using current-based phase modulators 509A and 509B. The two arms of the unbalanced interferometer 510 contain p-i-n junction phase modulators (PIMPMs) 509A and 509B. The PINPM devices impress a phase modulation on the optical beam that is dependent on the current flow. By testing the structure with and without the bias light via the grating coupler 505C and comparing the resulting shift in the wavelength scan pattern, the combined responsivity of the photodiode and phase efficiency of the PINPM 509A can be extracted. This measurement is less accurate than the HSPM situation described above since the photocurrent can be reasonably different from the short circuit one due to the impedance of the PINPM. This issue can be mitigated by increasing the number of photodiodes connected in series, so that the turn-on voltage of the PINPM is distributed over a large number of cells, thus getting closer to a short circuit (0V) condition.

Figure 6:
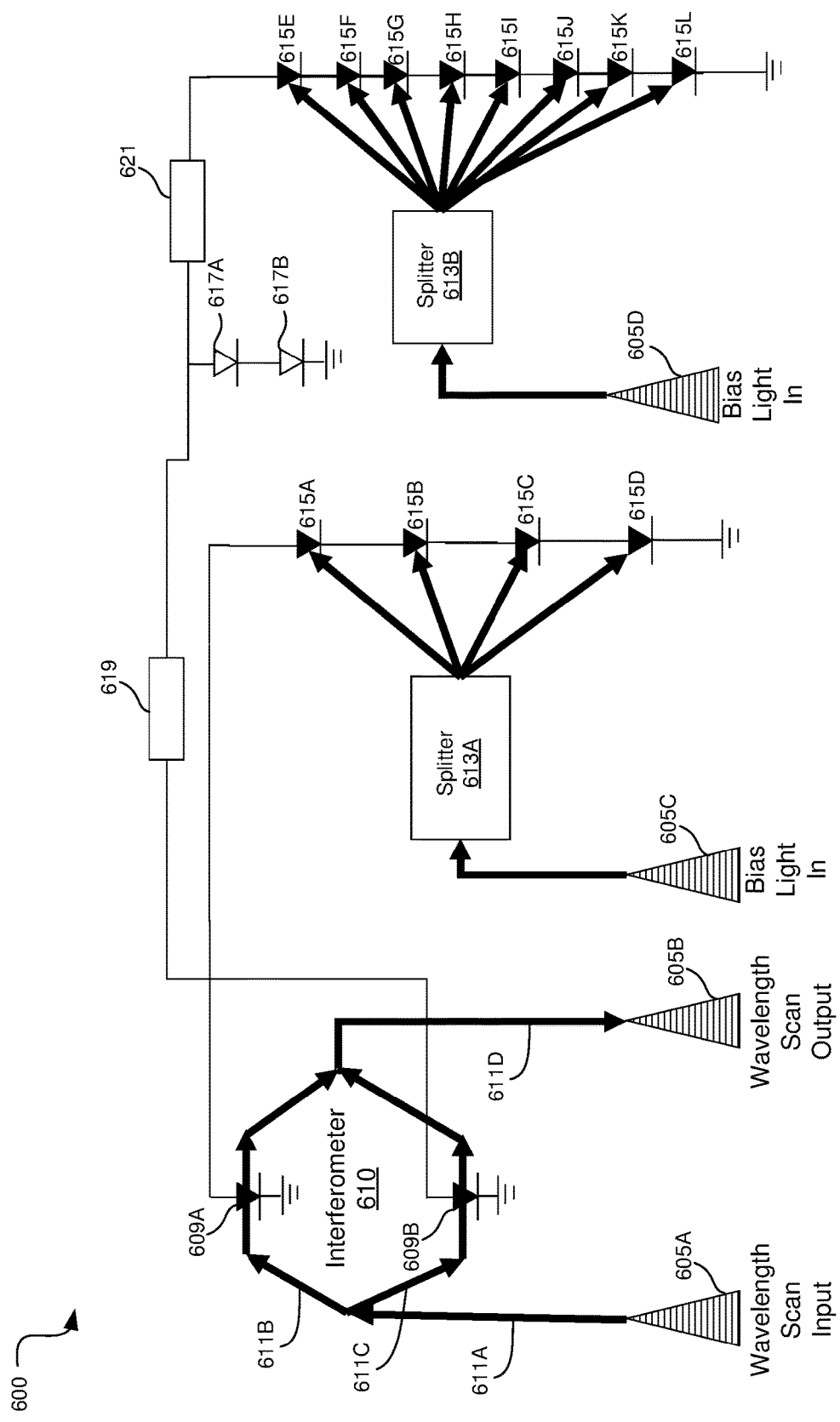
FIG. 6 illustrates optical wafer photodiode responsivity testing using a current regulated phase modulator and replica branch, in accordance with an example embodiment of the disclosure.

FIG. 6 illustrates optical wafer photodiode responsivity testing using a current regulated phase modulator and replica branch, in accordance with an example embodiment of the disclosure. Referring to FIG. 6, there is shown optical wafer testing system 600 with two optical source branches coupled via grating couplers 605C and 605D. This enables the determining of the PINPM phase shift efficiency using a third branch, which sets a relatively accurate current through using resistor 619 on a replica PINPM 609B of the PINPM 609A. Once the PINPM efficiency is calibrated out, the photodiode responsivity can be accurately extracted, assuming that the PINPMs 609A and 609B on the two branches of the interferometer 610 are well matched.

The phase modulators 609A and 609B and waveguides 611A-611D may comprise an optical modulator interferometer 610 with input optical signals received via the coupler 605A and output optical signals communicated out of the wafer via the coupler 605B.

The couplers 605A-605D may comprise grating couplers, for example, where the couplers 605A and 605B couple optical signals into and out of, respectively, the interferometer 610, and the couplers 605C and 605D couple biasing optical signals into the splitters 613A and 613B. The couplers 605A-605D may comprise single polarization grating couplers or polarization splitting grating couplers, although single polarization grating couplers are shown in FIG. 6. The splitters 613A and 613B may comprise 1:N optical splitters, where N=4 for splitter 613A and N=8 for splitter 613B in the example of FIG. 6, and may split optical signals received via the couplers 605C and 605D, respectively, to each of the photodiodes 615A-615D and 615E-615L.

The resistors 619 and 621 and forward-biased diodes 617A and 617B may comprise a voltage regulator for configuring a desired voltage to the phase modulator 609B from the larger bias voltage generated by the eight photodiodes 615E-615L. This regulation improves the control over the bias applied to the HSPM 609A and further reduces its dependency on the light impinging on the photodiodes 615E-615L, as the eight photodiodes 615E-615L generate a voltage well above that of two forward-biased diodes 617A and 617B, which accurately sets the voltage across the modulator 609B nearly independent of the coupling efficiency into the grating coupler 605D. In addition, the diodes 615A-615D apply a forward bias to modulator 609A when illuminated.

In operation, optical signals may be coupled into grating coupler 605A and the output optical signal may be coupled out of grating coupler 605B. The frequency and intensity of the input signal may be varied to assess wavelength response when no optical signal is coupled into Bias Light In input at grating coupler 605C, so that no bias is applied to the phase modulator 609A.

When an optical signal is coupled to the grating coupler 605C, the splitter 613A couples light to each of the photodiodes 615A-615D, thereby generating a bias voltage for phase modulator 609A. Similarly, when an optical signal is coupled to the grating coupler 605D, the splitter 613B couples light to each of the photodiodes 615E-615L, thereby generating a voltage. This voltage applied at resistor 621 applies a current to forward-biased diodes 617A and 617B, and this consistent voltage from the forward-biased diodes 617A and 617B is applied across phase modulator 609B via resistor 619. Optical signals may again be applied to the Wavelength Scan Input at grating coupler 605A and the output assessed at the Wavelength Scan Output at output coupler 605B, where the input signal may be varied in intensity and/or wavelength, assessing the interferometer 610 in a biased state. Therefore, an all-optical wafer test is enabled by the photonic and electronic circuit of FIG. 6.

In an example embodiment of the disclosure, a method and system is described for an all-optical wafer acceptance test. The system may comprise an all-optical wafer acceptance test an optical transceiver on a chip, the optical transceiver comprising first, second, and third grating couplers, an interferometer comprising first and second phase modulators, a splitter, and a plurality of photodiodes. A first input optical signal may be received in the chip via the first grating coupler, where the first input optical signal may be coupled to the interferometer. An output optical signal may be coupled out of the chip via the second grating coupler for a first measurement of the interferometer. A second input optical signal may be coupled to a third grating coupler and a portion of the second input optical signal may be communicated to each of the plurality of photodiodes via the splitter. A voltage may be generated using the plurality of photodiodes based on the second input optical signal and the first phase modulator may be biased using the generated voltage. The output optical signal may be measured for a second measurement of the interferometer with the first phase modulator being biased by the generated voltage.

The first phase modulator may be reverse-biased using the generated voltage or may be forward biased using the generated voltage. The generated voltage may be regulated using a series-coupled resistor and a pair of forward-biased photodiodes coupled to ground. A third input optical signal may be coupled to a fourth grating coupler and a second voltage may be generated using a second plurality of photodiodes based on the third input optical signal. The second phase modulator may be biased using the second voltage and the output optical signal may be measured for a third measurement of the interferometer with the second phase modulator being biased by the second voltage. The plurality of photodiodes may comprise germanium. The chip may comprise a complementary metal oxide semiconductor (CMOS) die.

While the present disclosure has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
   receiving a first input optical signal via a first grating coupler coupled to an interferometer;
   propagating the first input optical signal from the first grating coupler to the interferometer;
   obtaining a first measurement of an output optical signal received by a second grating coupler coupled to the interferometer, wherein the output optical signal is output by the interferometer based on the first input optical signal;
   receiving a second input optical signal via a third grating coupler;
   communicating a portion of the second input optical signal to each photodiode of a plurality of photodiodes via a splitter;
   biasing a first phase modulator of the interferometer using a voltage generated by the plurality of photodiodes based on the second input optical signal;
   obtaining a second measurement of the output optical signal received by the second grating coupler while the first phase modulator is biased by the voltage; and
   extracting a phase shift efficiency of the first phase modulator based on the voltage, the first measurement and the second measurement.

2. The method according to claim 1, further comprising reverse biasing the first phase modulator using the voltage.

3. The method according to claim 1, further comprising forward biasing the first phase modulator using the voltage.

4. The method according to claim 1, further comprising regulating the voltage using a series-coupled resistor and a pair of forward-biased photodiodes coupled to ground.

5. The method according to claim 1, further comprising coupling a third input optical signal to a fourth grating coupler.

6. The method according to claim 5, further comprising generating a second voltage using a second plurality of photodiodes based on the third input optical signal.

7. The method according to claim 6, further comprising biasing a second phase modulator of the interferometer using the second voltage.

8. The method according to claim 7, further comprising obtaining a third measurement of the output optical signal while the second phase modulator is biased by the second voltage.

9. The method according to claim 1, wherein the plurality of photodiodes comprise germanium.

10. A system comprising:
    an optical transceiver on a chip, the optical transceiver comprising first, second, and third grating couplers, an interferometer comprising first and second phase modulators, a splitter, and a plurality of photodiodes, the optical transceiver being operable to:
    receive a first input optical signal in the chip via the first grating coupler coupled to the interferometer;
    propagate the first input optical signal to the interferometer;
    propagate an output optical signal from the interferometer based on the first input optical signal out of the chip via the second grating coupler for a first measurement of the interferometer;
    receive a second input optical signal via a third grating coupler;
    communicate a portion of the second input optical signal to each photodiode of the plurality of photodiodes via the splitter;
    bias the first phase modulator using a voltage generated by the plurality of photodiodes based on the second input optical signal;

measure the output optical signal for a second measurement of the interferometer with the first phase modulator being biased by the voltage; and extract a phase shift efficiency of the first phase modulator based on the voltage, the first measurement and the second measurement.

11. The system according to claim 10, wherein the optical transceiver is operable to reverse bias the first phase modulator using the generated voltage.

12. The system according to claim 10, wherein the optical transceiver is operable to forward bias the first phase modulator using the generated voltage.

13. The system according to claim 10, wherein the optical transceiver is operable to regulate the generated voltage using a series-coupled resistor and a pair forward-biased photodiodes coupled to ground.

14. The system according to claim 10, wherein the optical transceiver is operable to receive a third input optical signal via a fourth grating coupler.

15. The system according to claim 14, wherein the optical transceiver is operable to generate a second voltage using a second plurality of photodiodes based on the third input optical signal.

16. The system according to claim 15, wherein the optical transceiver is operable to bias the second phase modulator using the second voltage.

17. The system according to claim 16, wherein a measurement of the output optical signal comprises a third measurement of the interferometer with the second phase modulator being biased by the second voltage.

18. The system according to claim 10, wherein the chip comprises a complementary metal oxide semiconductor (CMOS) die and the plurality of photodiodes comprise germanium.

19. A system comprising:
an interferometer including a first phase modulator;
a plurality of photodiodes;
a splitter connected to each photodiode of the plurality of photodiodes;
a first coupler configured to receive a first input optical signal for the interferometer;
a second coupler configured to receive an output optical signal from the interferometer based on the first input optical signal;
a third coupler configured to receive a second input optical signal and communicate a portion of the second input optical signal to each photodiode of the plurality of photodiodes via the splitter; and
wherein the plurality of photodiodes is configured to bias the first phase modulator via a voltage based on the second input optical signal.

20. The system of claim 19, wherein the voltage based on the second input optical signal is set by selecting a number of photodiodes of the plurality of photodiodes that to connect in series with the first phase modulator.

* * * * *

UNITED STATES PATENT AND TRADEMARK OFFICE
CERTIFICATE OF CORRECTION

PATENT NO. : 11,073,737 B2  
APPLICATION NO. : 16/729668  
DATED : July 27, 2021  
INVENTOR(S) : Gianlorenzo Masini et al.

Page 1 of 1

It is certified that error appears in the above-identified patent and that said Letters Patent is hereby corrected as shown below:

In the Specification

In Column 2, Line 2, delete "and or" and insert -- and/or --, therefor.

In Column 7, Line 67, delete "(PIMPMs)" and insert -- (PINPMs) --, therefor.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*